US008362835B2

(12) United States Patent
Meharry

(10) Patent No.: US 8,362,835 B2
(45) Date of Patent: Jan. 29, 2013

(54) DECADE BANDWIDTH PLANAR MMIC FOUR PORT TRANSFORMER

(75) Inventor: David E. Meharry, Lexington, MA (US)

(73) Assignee: Gradual Tech Software L.L.C., Dover, DE (US)

(*) Notice: Subject to any disclaimer, the term of this patent is extended or adjusted under 35 U.S.C. 154(b) by 0 days.

(21) Appl. No.: 13/214,345

(22) Filed: Aug. 22, 2011

(65) Prior Publication Data

US 2011/0304391 A1 Dec. 15, 2011

Related U.S. Application Data

(60) Division of application No. 12/493,907, filed on Jun. 29, 2009, now Pat. No. 8,026,775, which is a continuation-in-part of application No. 11/708,992, filed on Feb. 20, 2007, now Pat. No. 7,592,866, and a continuation-in-part of application No. 11/715,705, filed on Mar. 8, 2007, now Pat. No. 7,557,673.

(60) Provisional application No. 60/780,640, filed on Mar. 9, 2006, provisional application No. 60/774,582, filed on Feb. 17, 2006.

(51) Int. Cl.
*H03F 1/00* (2006.01)
(52) U.S. Cl. .......... 330/195; 330/165; 330/301
(58) Field of Classification Search .......... 330/195, 330/165, 301
See application file for complete search history.

(56) References Cited

U.S. PATENT DOCUMENTS

| | | | |
|---|---|---|---|
| RE25,064 E | * | 10/1961 | Kruesi .......... 342/417 |
| 3,885,219 A | * | 5/1975 | Vaughn .......... 330/255 |
| 3,972,020 A | * | 7/1976 | Carroll et al. .......... 367/45 |
| 4,397,037 A | | 8/1983 | Theriault |
| 4,606,046 A | | 8/1986 | Ludwick |
| 4,647,868 A | | 3/1987 | Mueller |
| 4,703,283 A | | 10/1987 | Samuels |
| 5,822,426 A | | 10/1998 | Rasmus et al. |
| 6,046,641 A | | 4/2000 | Chawla et al. |
| 6,545,542 B2 | | 4/2003 | Matsuyoshi et al. |
| 6,683,510 B1 | | 1/2004 | Padilla |
| 6,696,885 B2 | * | 2/2004 | Christensen .......... 327/552 |
| 6,792,252 B2 | * | 9/2004 | Kimball et al. .......... 455/127.3 |
| 7,119,615 B2 | * | 10/2006 | Ten Dolle et al. .......... 330/252 |
| 7,242,268 B2 | | 7/2007 | Hagiwara et al. |
| 7,580,693 B2 | | 8/2009 | Rohde et al. |
| 2008/0007335 A1 | | 1/2008 | Park et al. |

OTHER PUBLICATIONS

Maas, Nonlinear Microwave Circuits, Artech House Inc., Norwood, MA 1988, pp. 226-231 & pp. 240-243.
Cripps, Advanced Techniques in RF Power Amplifier Design, Artech House Inc., Norwood, MA, 2002, pp. 272-279.
Meharry et al., Broad bandwidth Transformer Coupled Differential Amplifiers for High Dynamic Range, IEEE Journal of Solid-State Circuits, vol. 34, No. 9, Sep. 1999, pp. 1233-1238.
Oltman, The Compensated Balun, IEEE Transactions on Microwave Theory and Techniques, vol. MTT-14, No. 3, Mar. 1966, pp. 112-119.
Tsai, A New Compact Wideband Balun, IEEE Microwave and Millimeter-Wave Monolithic Circuits Symposium, 1993, pp. 123-124.

(Continued)

*Primary Examiner* — Patricia Nguyen
(74) *Attorney, Agent, or Firm* — Connolly Bove Lodge & Hutz LLP

(57) ABSTRACT

A wide bandwidth planar four port MMIC transformer is provided by input diplexers which divide up the incoming signal into a high band and a low band, with the resulting signals coupled to high band and low band four port transformers implemented in one embodiment using spiral inductors and coupled lines, the outputs of which are combined using two output diplexers to provide a decade bandwidth transformer.

16 Claims, 14 Drawing Sheets

OTHER PUBLICATIONS

Yoon et al., A Silicon Monolithic Spiral Transmission Line Balun With Symmetrical Design, IEEE Electron Device Letters, vol. 20, No. 4, Apr. 1999, pp. 182-184.

Pavio et al., A Monolithic Or Hybrid Broadband Compensated Balun, IEEE MTT-S Digest, 1990, pp. 483-486.

Barber, Enhanced Coupled, Even Mode Terminated Baluns and Mixers Constructed Therefrom, IEEE MTT-S Digest, 1990, pp. 495-498.

Minnis et al., New Broadband Balun Structures for Monolithic Microwave Integrated Circuits, IEEE MTT-S Digest, 1991, pp. 425-428.

Gu et al., Broadband Design Consideration Of Uniplanar Double-Y Baluns for Hybrid and Monolithic Integrated Circuits, IEEE, 1999 (4 unnumbered pages).

Collin, Foundations for Microwave Engineering, McGraw-Hill Book Company, 1966, pp. 172-176, Kogakusha Company, Ltd., Tokyo, Japan.

Marchand, Transmission-Line Conversion Transformers, Electronics, Dec. 1944, pp. 142-145, McGraw-Hill Publishing Company, NY.

* cited by examiner

DECADE BANDWIDTH PLANAR MMIC FOUR PORT TRANSFORMER

RELATED APPLICATIONS

This application is a Divisional application of Ser. No. 12/493,907 filed Jun. 29, 2009, which is a Continuation-in-Part of U.S. patent application entitled, "Wide Band Differential Amplifier Including Single-Ended Amplifiers Coupled To A Four-Port Transformer," Ser. No. 11/708,992, filed Feb. 20, 2007, and a Continuation-in-Part of U.S. patent application entitled, "Wide Bandwidth Microwave Balun," Ser. No. 11/715,705, filed Mar. 8, 2007, which claim priority, respectively, to U.S. provisional patent application Nos. 60/774,582, filed Feb. 17, 2006, and 60/780,640, filed Mar. 9, 2006.

FIELD OF THE INVENTION

This invention relates to microwave and RF circuits and more particularly to a decade bandwidth planar MMIC four port transformer for use in microwave differential amplifiers and for microwave applications for which balanced signals are required.

BACKGROUND OF THE INVENTION

As described in U.S. patent application Ser. No. 11/708,992 filed Feb. 20, 2007 entitled Wide Band Differential Amplifier Including. Single-Ended Amplifiers Coupled To A Four Port Transformer and assigned to the assignee hereof, and incorporated herein by reference, it is only with difficulty that one can provide a wideband microwave differential amplifier. These amplifiers are used to suppress the common mode and allow for the passage of the differential mode. This patent application describes the utilization of transformers which are four port devices in which first and second single-ended amplifier circuits are coupled to a four port transformer circuit. However, the transformer described in this application is only capable of a 3:1 bandwidth, insufficient for a large number of microwave applications.

It is noted at lower frequencies, a conventional differential amplifier typically utilizes "long tailed pair" topology. With this topology, two input transistors each receive a respective input signal, with the transistors having their source or emitter terminals interconnected and connected to a constant current source.

As mentioned in this patent application this topology can often result in instability of the amplifier at higher frequencies and also is inadequate due to the fact that it can have a poor common mode rejection ratio. Poor common mode characteristics result in the amplifier being unable to adequately suppress signals present on both the inputs supplied to the input transistors. Moreover, at centimeter and millimeter wavelengths, wide band or broadband differential amplifiers having relatively constant gain for input signals over a wide range of frequencies are typically difficult to design when using the long tailed pair topology.

It will be appreciated that in differential amplifiers intermodulation distortion results from two input signals of different frequencies being mixed together due to non-linearities in the transfer characteristics of the device receiving these two signals. Note that mixing or intermodulation distortion of the two signals to a differential amplifier forms additional signals at frequencies that are at harmonic frequencies, or at combinations of integer multiples of either the frequencies of the input signals or their harmonics. This results in intermodulation products referred to as second order or third order intermodulation.

Also as mentioned in this application, a differential amplifier with good common mode rejection should suppress the even order intermodulation distortion signals. If the differential amplifier has poor common mode rejection, then these signals may not be adequately suppressed and may be present at the output of the differential amplifier. While these signals can sometimes be canceled out in narrow band applications, in wide band differential amplifiers intermodulation distortion signals are not filtered out and must be suppressed.

As described in the aforementioned patent application, the differential amplifier includes first and second single-ended amplifier circuits coupled to a four port transformer. The properties of the transformer which are sufficient to fully describe and specify the correct operation for use in said differential amplifier are also a subject of this invention. One type of component which meets these requirements is the so-called center tap transformer.

This having been said, the configuration described in the aforementioned patent application is limited in bandwidth to only a 3 or 4:1 bandwidth. This flies in the face of the requirement for a very high dynamic range broadband amplifier and also the requirement for directly interfacing to balanced antenna interfaces.

Note, most microwave differential amplifiers are made to operate primarily in the 1 to 20 gigahertz range, although the principals described herein apply to millimeter waves up to 100 gigahertz or higher.

More particularly, it is only with difficulty that differential amplifiers can be made to operate in the microwave range. If one could design a suitable wide band differential amplifier, it would allow one to accomplish the same type of tasks at the microwave range that can be done at audio frequencies or megahertz frequencies. However, these types of differential amplifiers have been difficult to implement at microwave frequencies. Particularly, isolation of signals from ground is virtually impossible with the microwave circuits presently in use; and this hinders the floating of signals. One of the reasons is the inability to provide a center-tapped transformer using MMIC technology. Note, center-tap transformers are normally not available utilizing MMIC technology which involves depositing circuits on planar surfaces. If one could have something other than a planar coil one might be able to provide a center-tapped configuration. However, such transformers are difficult to implement in an ultra small planar MMIC configuration.

One would also like to have a differential amplifier operating in the microwave region of the electromagnetic spectrum with a good common mode rejection ratio in which noise at the two inputs of the differential amplifier of the same amplitude and phase are suppressed. On the other hand, it is desirable that a differential signal at the two inputs be passed and amplified.

Thus, a true differential amplifier should have the capability to suppress second harmonic and second order distortion products, and there is a requirement to provide a differential amplifier that can do so. Also, it is important to provide such a structure for antenna interfaces which have balanced inputs.

It might be thought that one could utilize baluns to provide a balanced output from an unbalanced input. However, losses are associated with the use of baluns that greatly degrades sensitivity in the receive mode and also degrades overall power efficiency or output power capability in the transmit mode. If one could provide a true wideband differential amplifier, then one would be able to eliminate interfaces and circuit components that degrade the performance of the system.

As far as the microwave region of the electromagnetic spectrum, the above patent application describes separating the amplifying elements into something that can be independently designed as single-ended amplifiers and then recombining their outputs using a four port transformer to provide the differential amplification function.

While the amplifier elements can themselves be designed to operate over almost any bandwidth and any frequency, one could achieve almost arbitrarily wide bandwidth if one added a four port transformer element whose bandwidth was likewise unlimited. However transformers available utilizing MMIC technology have heretofore been limited to a 4:1 bandwidth.

SUMMARY OF INVENTION

The four port transformer of the aforementioned patent application is replaced with a modification to the technology used to provide a wide bandwidth microwave MMIC balun that is described in U.S. patent application Ser. No. 11/715,705, filed Mar. 8, 2007, assigned to the assignee hereof and incorporated herein by reference. Note, these baluns are called balplex baluns and have a 10:1 bandwidth. However, these baluns are three port devices, not four port devices. It is desirable to take the topology of the three port wideband device described above and to alter it to provide a different function, namely to provide a wide bandwidth four port device, in one embodiment a transformer.

The 4-port circuit needs to have just three properties to do the job:

1. Symmetry, e.g. top to bottom topology symmetry.
2. Reciprocity, meaning that any circuit comprised of ordinary non-amplifying and non-magnetic components is reciprocal. In s-parameter terminology this equates to Sij=Sji. Amplifiers and isolators or circulators are not reciprocal.
3. Inverting relationship from one input to each of the outputs. That is the relationship of the signal traveling from one input to one output is equal in amplitude and 180 degrees different in phase from the signal traveling to the other output.

Note that symmetry means the two inputs are equivalent, as are the two. outputs. Reciprocity means that the same relationship holds from output to input. In s-parameter terms for the 4-port, if ports 1 and 2 are inputs, 3 and 4 are outputs, then S31=-S41. By symmetry S32=-S42. By reciprocity S13=-S14 and S23=-S24, with symmetry S11=S22 and S33=S44.

As long as these three properties are in force or approximately in force, the 4-port network provides the common mode rejection required for converting single ended amplifiers into use for differential amplification. A simple transformer may not always meet these requirements, but a center tapped transformer will. While the subject four port device is described as being a transformer, there are circuits using only capacitors and inductors having no transformers or coupled lines that have the requisite behavior for use in a differential amplifier. Note, a pair of identical baluns could also be hooked up to meet the requirement.

In order to create the a wide bandwidth microwave differential amplifier, in the subject system one uses two four port MMIC transformers, a high band transformer and a low band transformer, each with a 4:1 bandwidth in which the transformers have overlapping bandwidths. These devices are fed from input diplexers in which the diplexer separates the band of the incoming signal into a low band and high band signal such that all incoming signals in a high frequency band go to one side of the diplexer, whereas those in a low frequency band go to the other side of the diplexer.

Having divided up the incoming signal into a high frequency band and a low frequency band, the low frequency signals are directed to a low band four port MMIC transformer, whereas the high frequency signals are directed to a high band four port MMIC transformer. The outputs of these transformers are then combined to provide a balanced output with a wide bandwidth that is the sum of the bandwidths of the MMIC transformers.

In short, in one embodiment the subject invention uses the coupled line topology of the three port network to provide a wideband four port transformer. The subject circuit uses two pairs of coupled lines to provide a low band transformer and two pairs of coupled lines to provide a high band transformer, along with modified diplexer components to provide input and output diplexers.

The major design difference between the three port and the four port structure is that in a three port structure there is an unused output, e.g. an open circuit.

In the subject configuration this unused output is provided with a separate output diplexer to provide the fourth port. These modifications convert the three port device into a four port device having the same bandwidth as its three port counterpart.

Note for the subject wideband four port transformer one has to have four diplexers. Two of these diplexers divide up the input signal into two bands, high and low, with the other two diplexers combining the signals at the outputs of the transformers. Thus, the subject circuit which has an exceptionally wide bandwidth is provided by breaking up the input signal into two overlapping bands; and then combining the resultant signals to provide a combined bandwidth at the balanced output. The result is a decade wide bandwidth transformer for use in a differential amplifier or in other microwave applications.

It is thus the purpose of the subject circuit to divide the input signals into their low and high frequency components so that they can be directed to respective low band and high band four port transformers, the recombined output of which provides the decade bandwidth for the four port device.

In a preferred implementation, the low band transformer is two pairs of spiraled coupled lines, in which there is an interconnection between them. The high band transformer is comprised of two pairs of coupled lines that encircle the entire device. Each of these transformers has appropriate ground connections, resulting in a device that is the equivalent of a center-tapped transformer.

In terms of the alteration of the balplex balun, the only changes are removal of the grounding capacitor which allows the introduction of DC bias, the addition of a series capacitor to the output end of the high band coupled line and a duplicate of the spiral inductor/series capacitor output diplexer for the additional output port. Note that the subject four port transformer improves the small signal common mode rejection ratio of a differential amplifier employing this four port transformer, with the parasitics of the high and low band transformers absorbed into the diplexer circuitry.

In summary, a wide bandwidth planar four port MMIC transformer is provided by input diplexers which divide up the incoming signal into a high band and a low band, with the resulting signals coupled to high band and low band four port transformers implemented in one embodiment using spiral inductors and coupled lines, the outputs of which are combined using two output diplexers to provide a decade bandwidth transformer.

BRIEF DESCRIPTION OF THE DRAWINGS

These and other features of the subject invention will be better understood in connection with the Detailed Description, in conjunction with the Drawings, of which.

DETAILED DESCRIPTION

Figure 1:
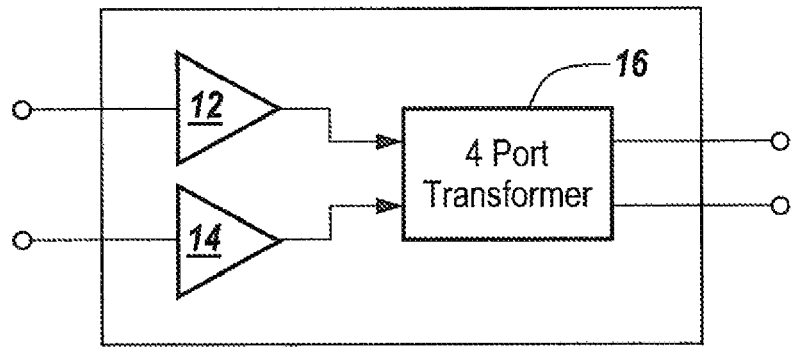
FIG. 1 is a diagrammatic illustration of one embodiment of a differential amplifier in which two single-ended amplifiers are coupled to a four port transformer.

Referring now to FIG. 1, a differential amplifier 10 may be composed of two single-ended amplifiers 12 and 14 having their outputs connected to a four port transformer 16, with the bandwidth of such a differential amplifier determined by the bandwidth of the four port transformer.

Figure 2:
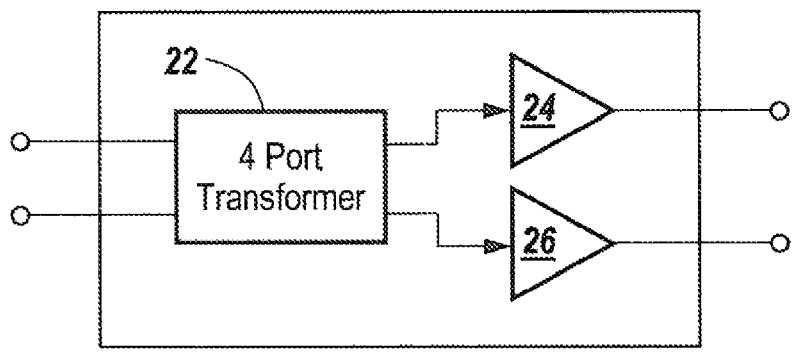
FIG. 2 is a diagrammatic illustration of a differential amplifier in which a four port transformer is coupled to the inputs of two single-ended differential amplifiers.

Referring to FIG. 2, in a different configuration the differential amplifier includes a four port transformer 22 having outputs coupled to the inputs to single-ended amplifiers 24 and 26, with the bandwidth of this differential amplifier also dependant on the bandwidth of the four port transformer.

Figure 3:
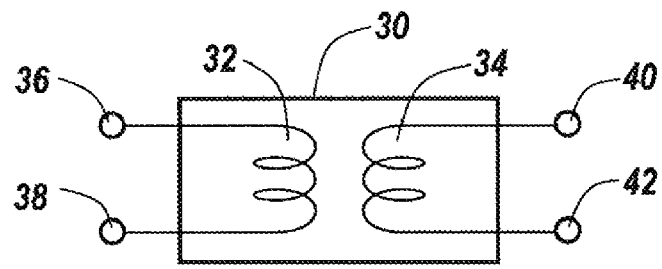
FIG. 3 is a diagrammatic illustration of a four port transformer.

Referring now to FIG. 3, a four port transformer 30 may be schematically illustrated as having a primary inductor 32 and a secondary inductor 34, with the transformer having input ports 36 and 38 and output ports 40 and 42.

As can be readily seen, the bandwidth of the differential amplifier is directly related to the bandwidth of the four port transformer and in the past four port transformers have been inadequate in terms of bandwidth, to say nothing of the fact that implementing them with MMIC technology in a planar structure has been exceedingly difficult.

As mentioned above, there is a MMIC technology which involves the utilization of planar coupled line and spiral coupled line elements that have been previously used to expand the bandwidth of a balun, which inter alia converts an unbalanced input to a balanced output.

Figure 4:
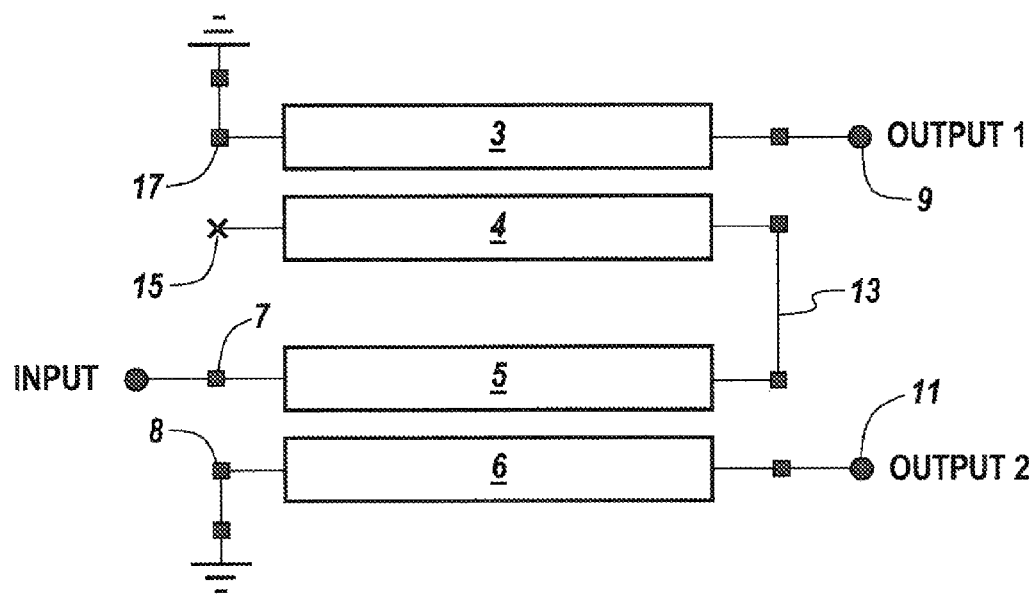
FIG. 4 is a block diagram of a coupled line design for a three port device that functions as a compensated balun in which there is an open unused port.

As diagrammatically shown in FIG. 4 a balun can take the form of a coupled line architecture. As described in the aforementioned patent application, the balun bandwidth for the circuit of FIG. 4 approaches 4:1, and is a member of the class of compensated baluns described by H. G. Oltman, Jr. "The Compensated Balun" in Transactions on Microwave Theory and Techniques, MTT-14 pp. 112-119, 1966.

In this case the balun is illustrated as provided by pairs of coupled lines 3 and 4, and coupled lines 5 and 6. Here the unbalanced input is between input terminals 7 and 8 with terminal 8 grounded. The balanced output is obtained between terminals 9 and 11. Note that grounded terminals 8 and 17 together effectively comprise a grounded center tap.

Figure 17:
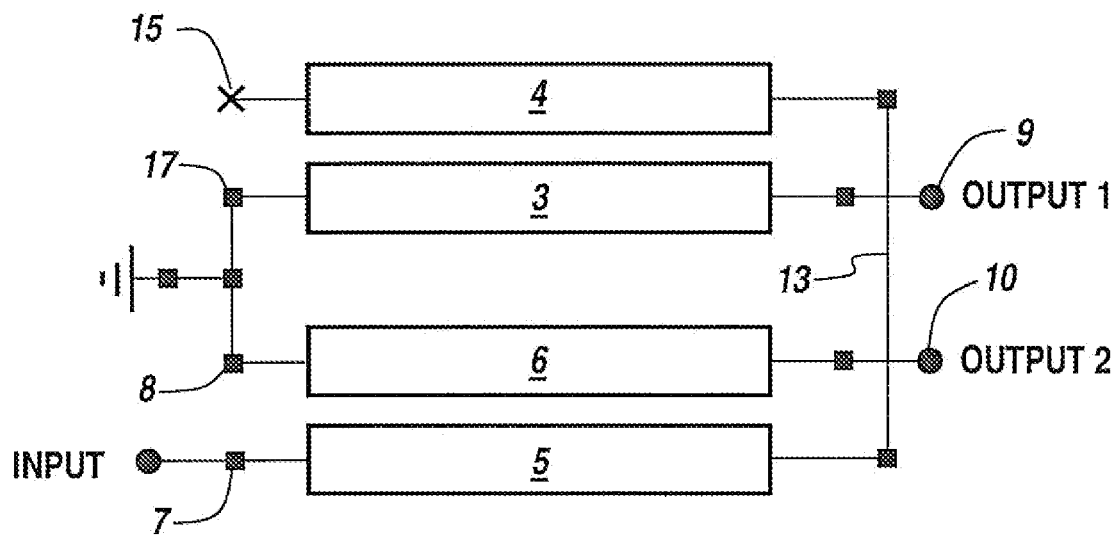
FIG. 17 is an electrically equivalent schematic or block diagram of the compensated balun of FIG. 4; and, FIG. 18 is an electrically equivalent schematic or block diagram of the four port coupled line transformer of FIG. 8.

Referring to FIG. 17, the balun of FIG. 4 has been redrawn into an electrically equivalent configuration. While the ground connections 8 and 17 of FIG. 4 have been shown as separated, it is apparent that the circuit of FIG. 4 can be redrawn or rearranged with no effect on performance to show that they act electrically as a common connection for a grounded center tap.

Figure 5:
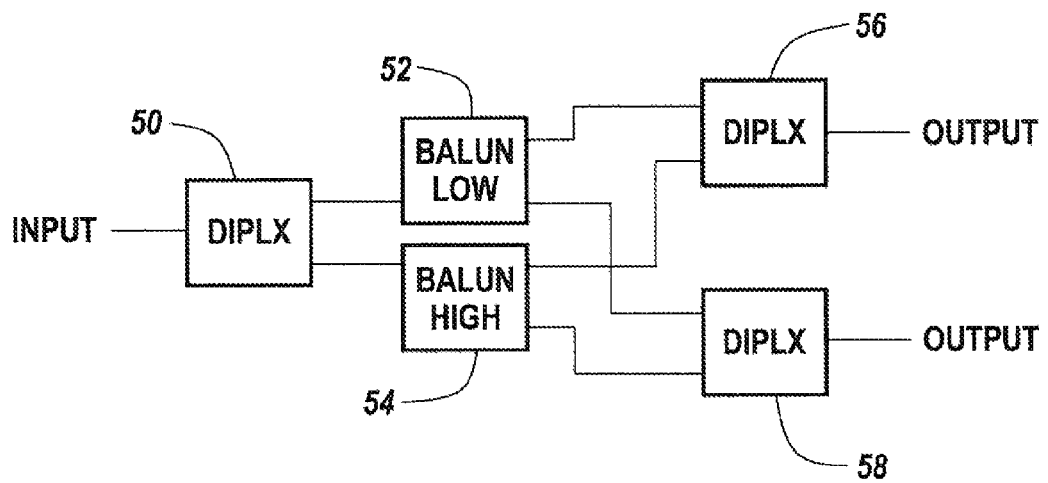
FIG. 5 is a block diagram of a balplex balun indicating an input having its frequency band split in two and provided to a high band and low band balun respectively, the outputs of which are coupled to diplexers to provide a balanced output.

Referring to FIG. 5, two of the compensated baluns of FIG. 4, one tuned to the low band and the other tuned to the high band, is shown diagrammatically to include a diplexer 50 which divides the incoming signal into a high band and a low band, after which the signals are coupled respectively to a low band balun 52 and a high band balun 54. The outputs of these baluns are coupled to diplexers 56 and 58 to provide the required balanced output.

Figure 6:
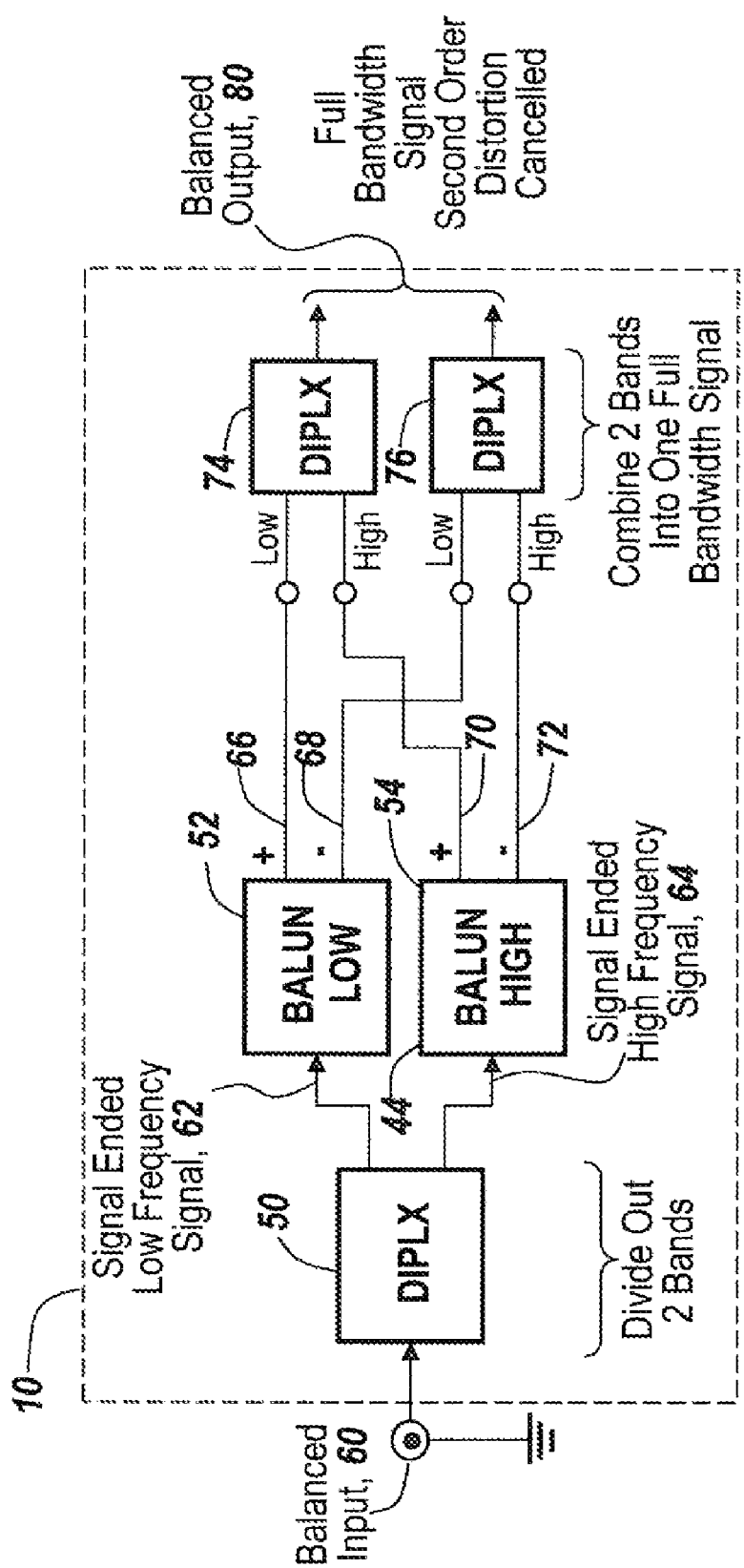
FIG. 6 is a diagrammatic illustration of the balplex balun of FIG. 5 illustrating the unbalanced input converted to a full bandwidth output.

Referring to FIG. 6, it can be seen that an unbalanced input 60 is coupled to diplexer 50 which provides a single-ended low frequency signal 62 to balun 52 and a single-ended high frequency signal 64 to high band balun 54. Here it can be seen that these baluns have plus and minus outputs respectively 66, 68, 70 and 72 providing high and low band inputs to diplexers 74, and 76 that combine the signals in the two bands into one full bandwidth signal and provides it as a balanced output at 80.

Figure 7:
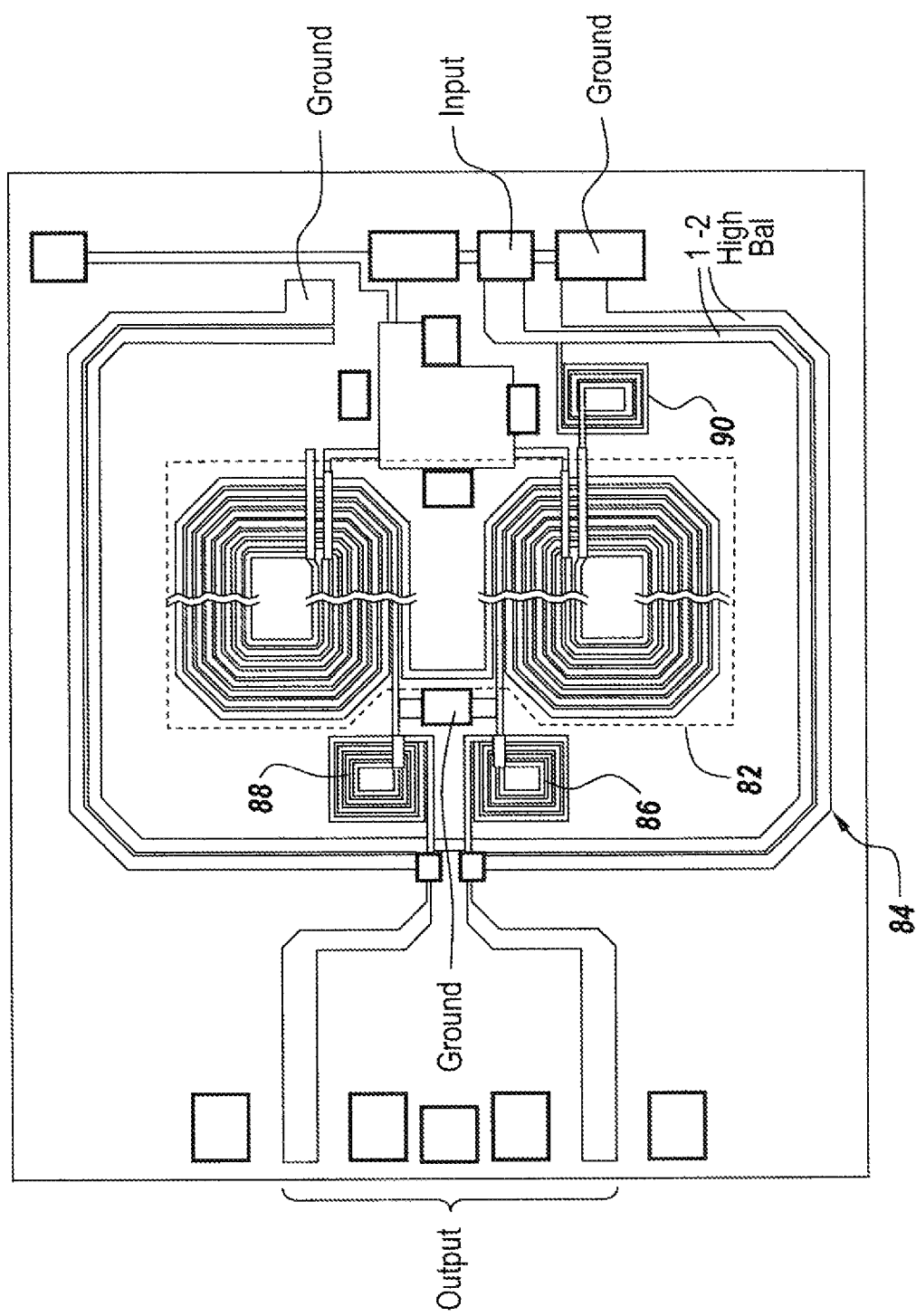
FIG. 7 is a diagrammatic illustration of the balplex balun of FIG. 6 illustrating the MMIC planar spiral coupled lines for the low band balun.

Referring to FIG. 7, the MMIC topology that provides for the wide bandwidth balun of FIG. 6 is shown. It will be appreciated that the baluns are nothing more than spiraled coupled lines that form the coupled lines for the low band balun as illustrated at 82, whereas the high band balun is provided by coupled lines 84, the sum of which provide for the high band coverage. In one embodiment the low band spirals cover from 2 to 7 gigahertz, whereas the high band balun coupled lines covers between 6 and 20 gigahertz. Note that the spiral inductors 86 and 88, which are coupled to the low band balun 82 which functions between 2 and 7 gigahertz form part of the output diplexer function. Note that a spiral inductor 90, which is coupled to the input of the low band balun 82 and forms part of the input diplexer function. As described in the aforementioned patent application, various parasitic elements in the circuit of FIG. 7 also make up parts of the function of the indicated diplexers.

Figure 8:
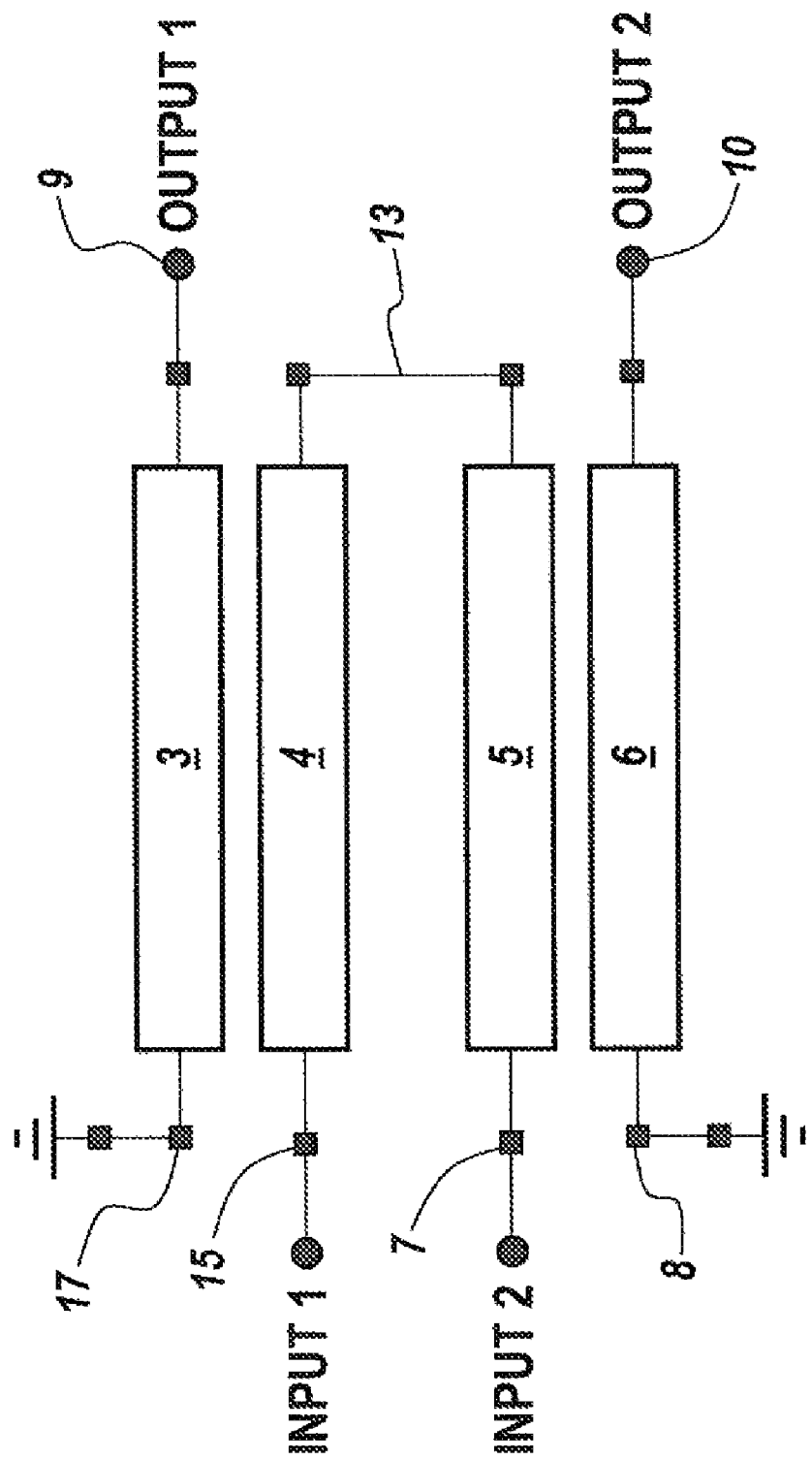
FIG. 8 is a block diagram of the coupled line configuration of FIG. 4, now utilizing the unused port as an input to provide the wide bandwidth four port transformer of the subject invention.

How this topology for the three port device can be utilized to fabricate a wideband four port transformer is now described in connection with FIG. 8. Here the same coupled lines 3, 4 and 5, 6 are connected identically to the circuit shown in FIG. 4. Here however terminal 15, rather than being open is now coupled to an additional input for the four port device.

Figure 9:
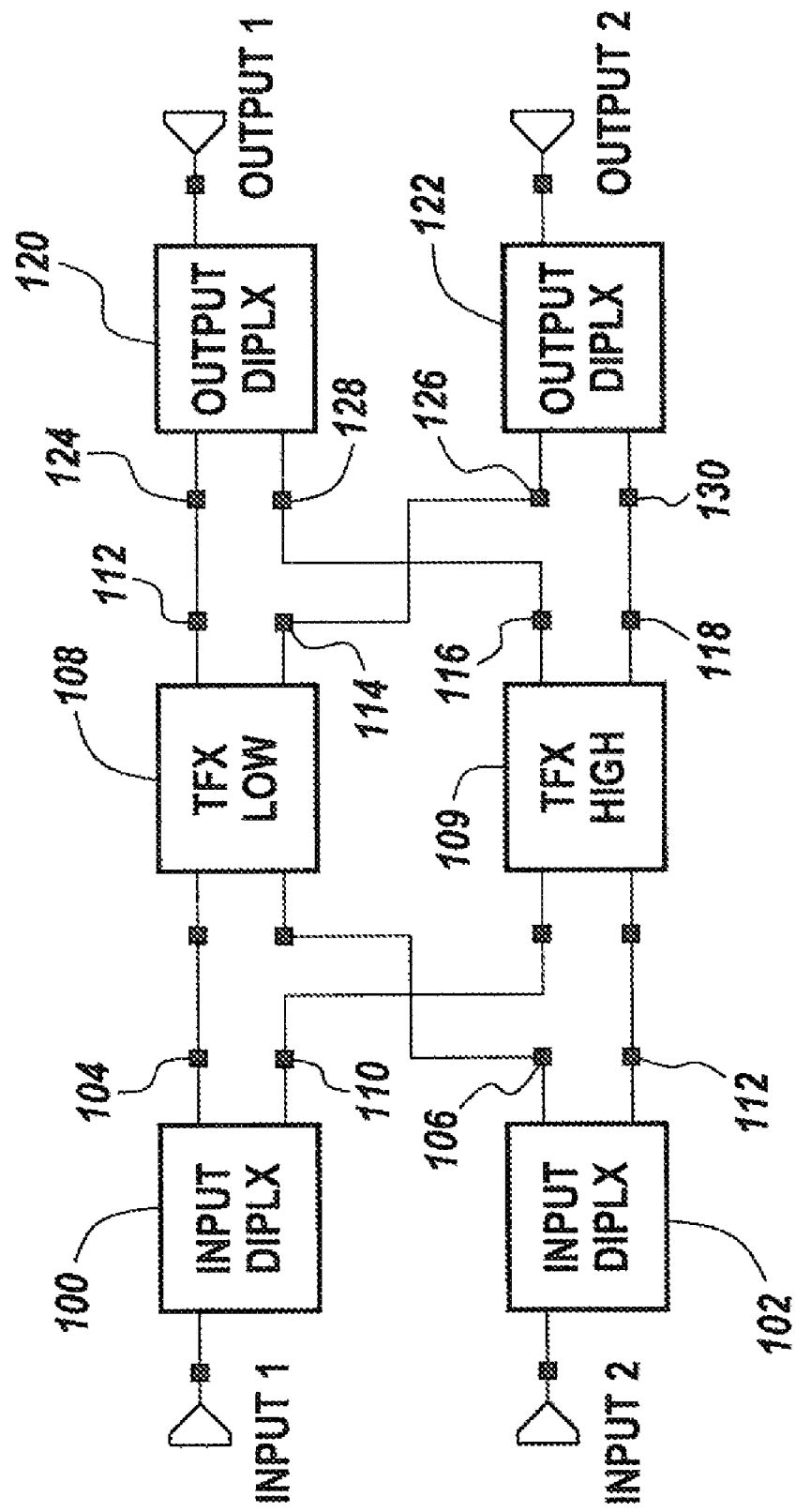
FIG. 9 is a block diagram of the implementation of the coupled line configuration of FIG. 8 to provide a wide bandwidth transformer in which input diplexers divide the input signals at inputs 1 and 2 into high band and low band components coupled to high band and low band transformers, the outputs of which are coupled to output diplexers for providing a balanced output.

How this coupled line balun structure can be utilized to provide a wide bandwidth transformer is now discussed in connection with FIG. 9. Here it can be seen that from a schematic point of view input 1 and input 2 are coupled to input diplexers 100 and 102 respectively. The low band outputs for diplexers 100 and 102, here shown at 104 and 106 are coupled to a low band transformer 108, whereas the high band outputs of diplexers 100 and 102, namely outputs 110 and 112, are coupled to a high band transformer 109. The combining of the outputs 112, 114, 116 and 118 of these transformers is accomplished through output diplexers 120 and 122, with the low band outputs from 112 and 114 coupled respectively to input terminals 124 and 126 of respective diplexers 120 and 122; whereas high band outputs 116 and 118 are coupled respectively to output diplexers 120 and 122 at inputs 128 and 130.

Figure 10:
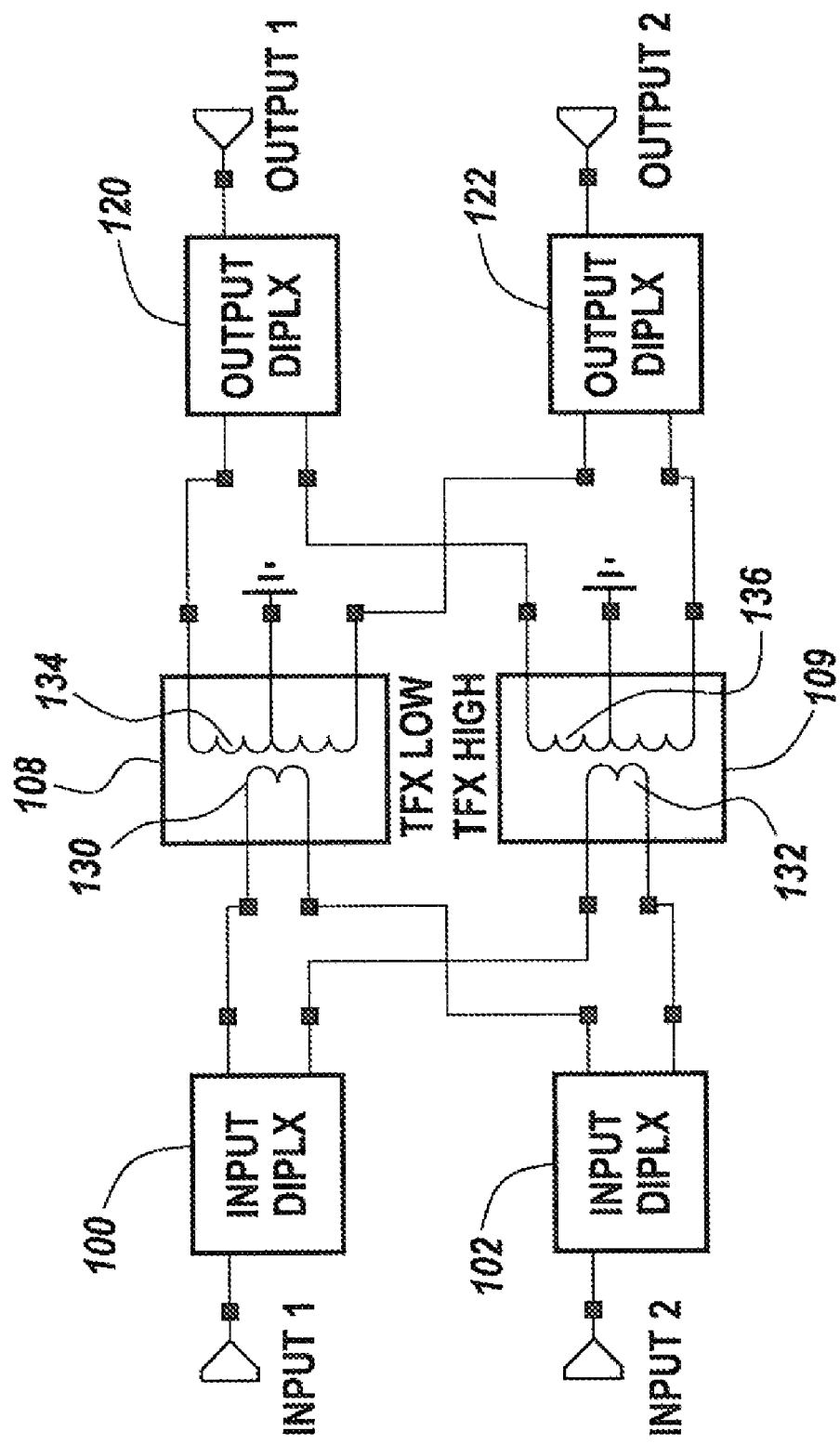
FIG. 10 is a diagrammatic illustration of the high band and low band transformers of FIG. 9 illustrating that with the use of a spiraled MMIC planar configuration the transformers can be fabricated with a grounded center-tap useful in common mode rejection for differential amplifiers.

Referring to FIG. 10, again from a schematic point of view, high and low band transformers 108 and 109 can be conceived of having primary inductors respectively 130 and 132 coupled to secondary center-tapped inductors 134 and 136. The center tap inductor can also be placed at the input side of the respective transformers.

As will be seen, the balplex topology described hereinbefore is modified to provide for these center-tapped transformer configurations useful for differential amplifier applications to be able to float signals and for common mode rejection purposes.

Figure 11:
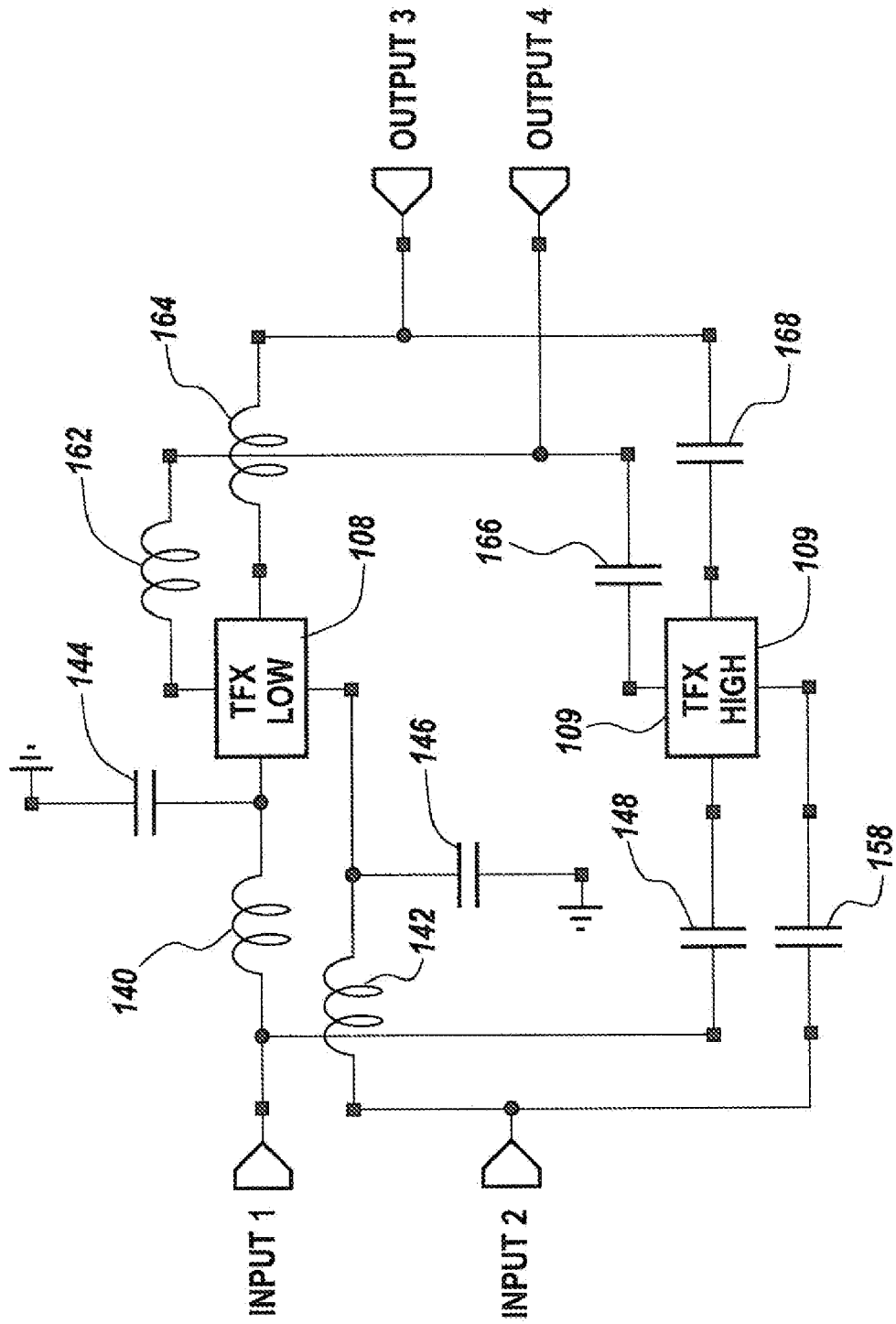
FIG. 11 is a diagrammatic illustration of the diplexers used in the subject invention showing additional inductors and capacitors.

Referring now to FIG. 11, the input diplexers described above can be characterized as low pass filters having inductors 140 and 142 coupled to respective shunt capacitors 144 and 146, whereas high pass series capacitors 148 and 158 provide a high pass filter for the high band components delivered to high band transformer 109. Likewise the aforementioned output diplexers can be characterized as having low pass series inductors 162 and 164, and high pass series capacitors 166 and 168 coupled to respective outputs 3 and 4 to provide the requisite combining of the high band and low band outputs of the respective low band and high band transformers, thereby providing an ultra-wide bandwidth transformer capable of being manufactured with MMIC topologies to be used, inter alia, in differential amplifiers to provide a double wide bandwidth due to the double wide bandwidth of the four port transformer itself.

Figure 12:
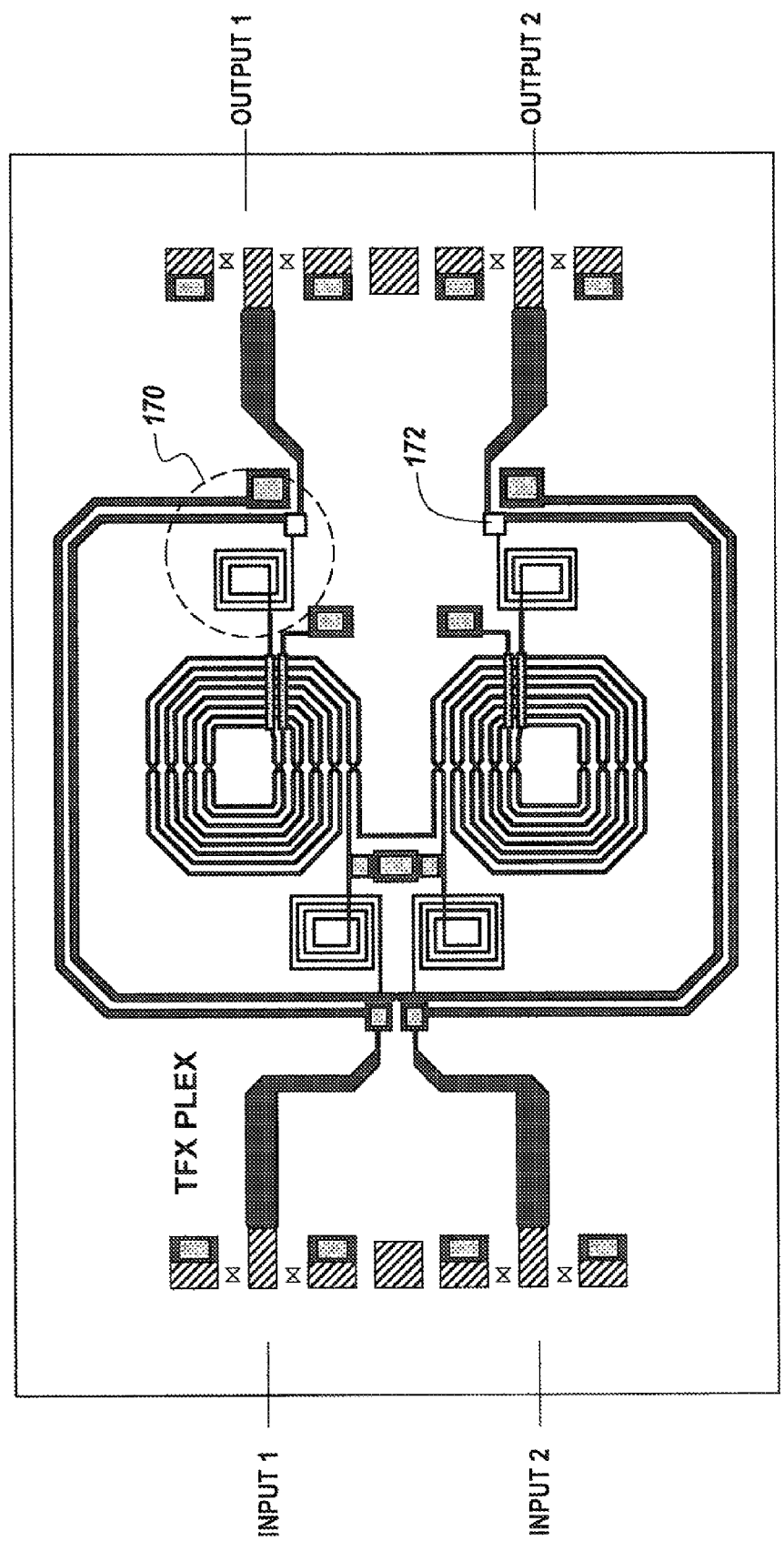
FIG. 12 is a diagrammatic illustration of the subject four port transformer showing the changes in the circuitry of a three port balun to make it function as a four port transformer.

Referring to FIG. 12, the differences between the balplex and the TFX plex MMIC configurations are such that additional components 170 provide for the additional output, whereas there is an added series capacitor 172 as illustrated. By taking the two existing output ports of the balun and using them as input ports, and by adding structures to the input side of the balun to function as output diplexers, one can reuse a large portion of the three port topology to make a wideband four port device.

Thus, the balplex configuration need only be slightly altered to provide the four port transformer function, with the coupled low band spiral inductors and the coupled high band lines operating similarly to the balun, but with the additional components being used to make the dual-band topology into a wideband four port device.

Figure 13:
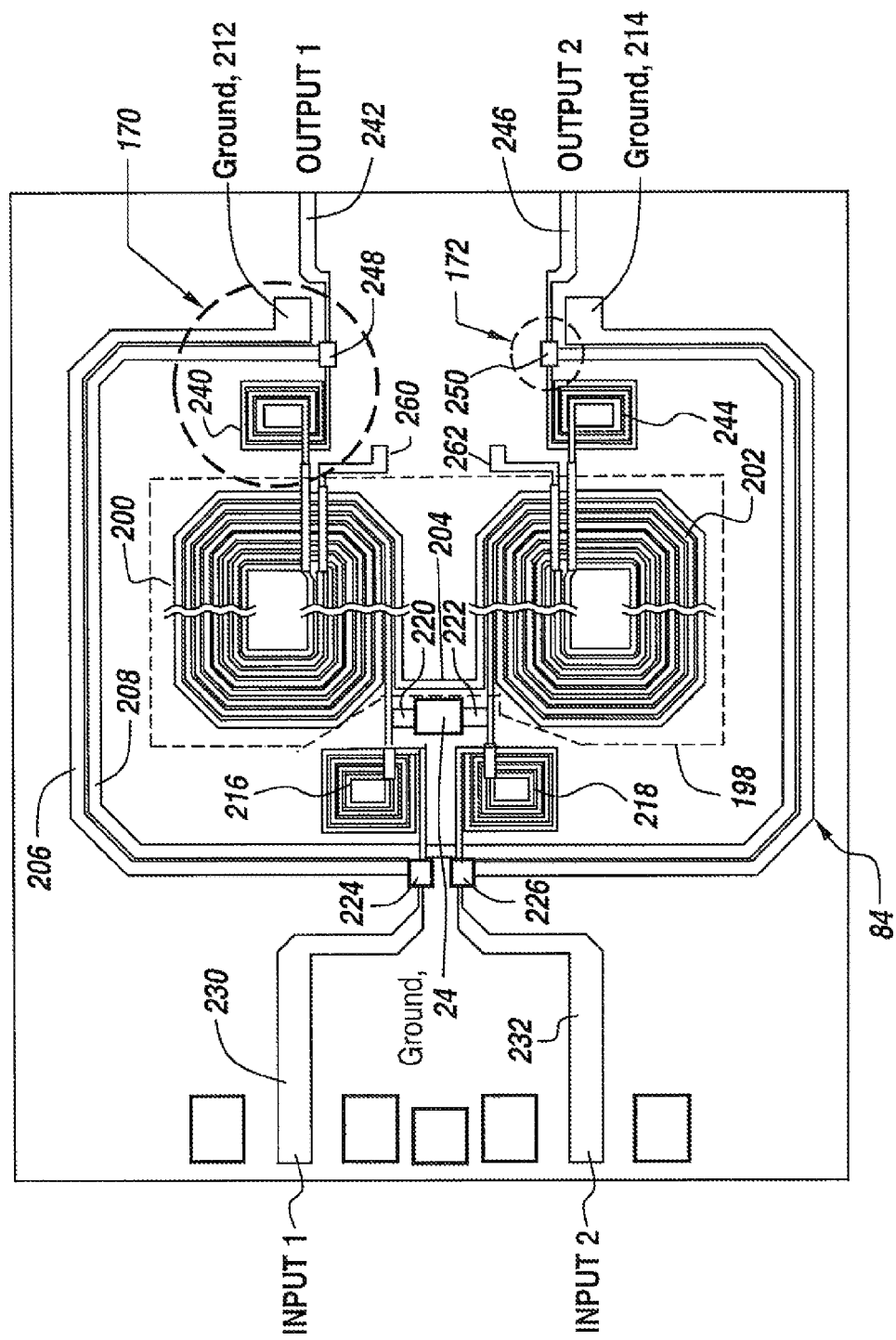
FIG. 13 is a more detailed diagrammatic illustration of the four port transformer of FIG. 12.

Referring now to FIG. 13, the MMIC topology of the four port transformer is shown.

Figure 18:
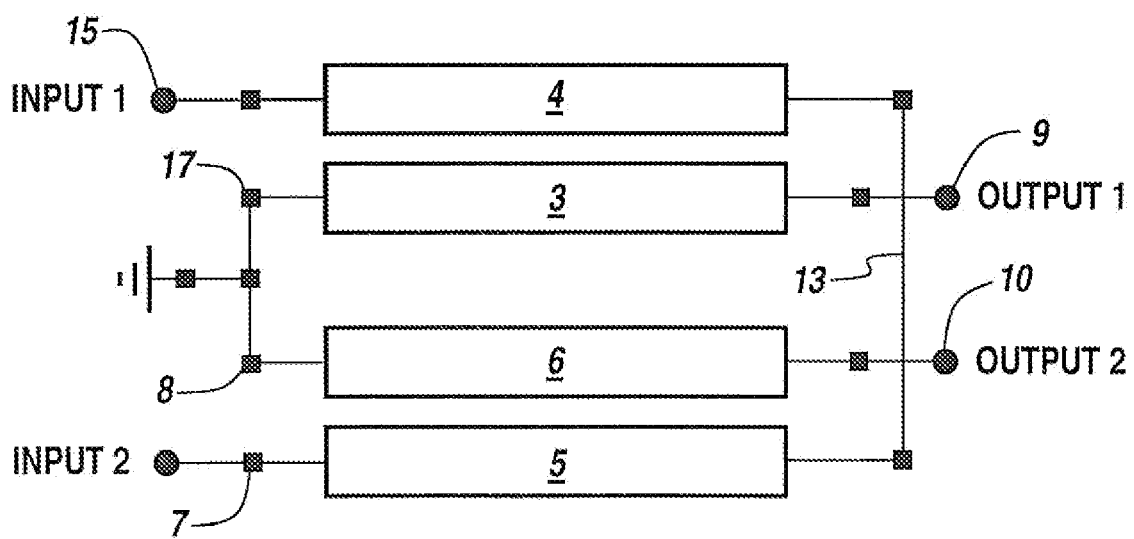
Figure 6:
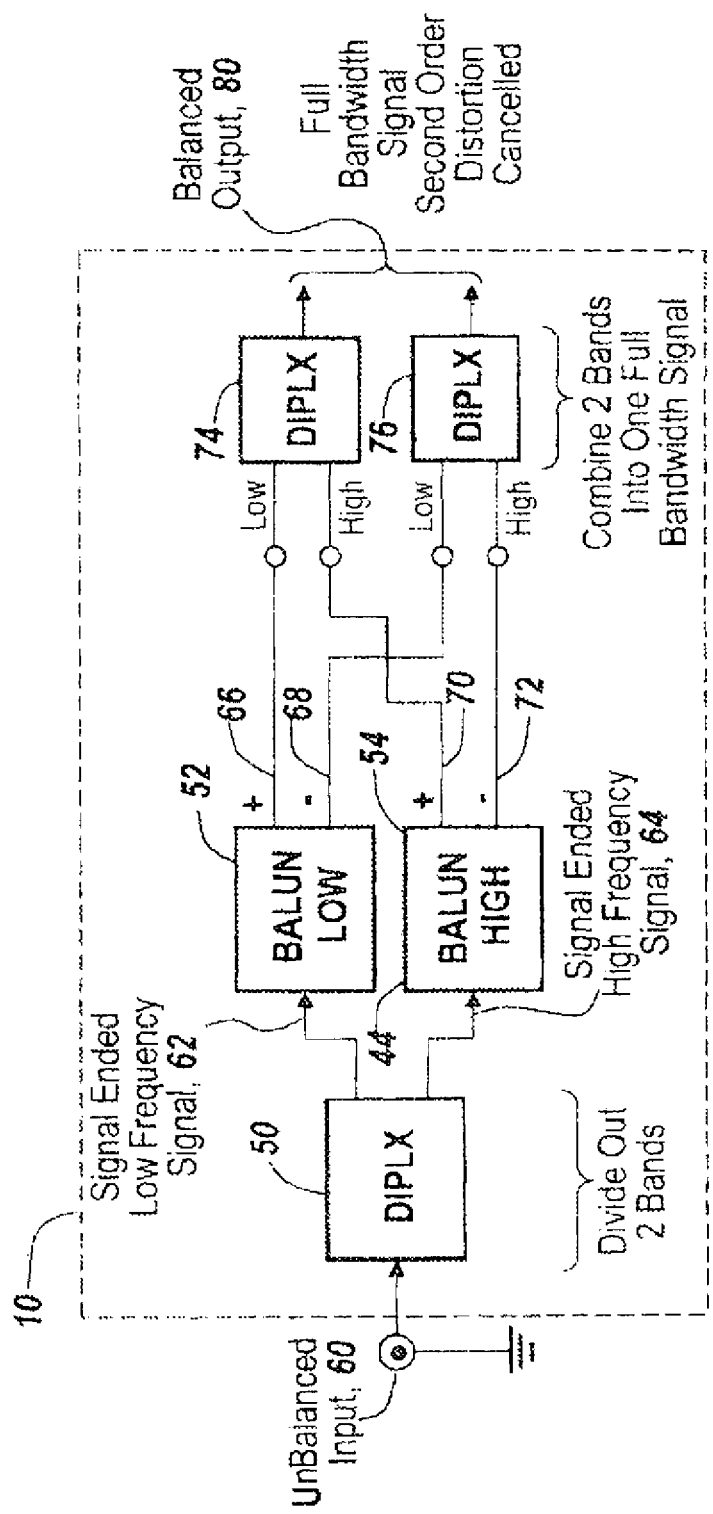

Here the high band and low band transformers are similar to the high band and low band baluns in that they have overlapping bands. As to the low band balun, this includes two spiraled coupled lines 200 and 202 shown with an interconnection 204 between them. Note that spiral 200 and 202 constitute coupled lines, with spiral 202 being a mirror image of spiral 200. The ground connections for the low band transformer are indicated by 260 and 262, and correspond to 8 and 17 in FIGS. 8 and 18.

As to the high band transformer, this transformer includes coupled lines 206 and 208, with an interconnection between the two at 210. Note that lines 206 and 208 have ground pads 212 and 214 as illustrated, which correspond to 8 and 17 in FIGS. 8 and 18. Note also that inductors 216 and 218 form series inductors as part of the low pass filter diplexer ahead of low band transformers 200 and 202. As illustrated, inductor 216 is associated with input 1 for transformer 200 shown at 230, whereas inductor 218 is associated with input 2 for transformer 202, shown at 232.

Also illustrated are shunt capacitors 220 and 222 with their associated ground 24 that complete the low pass filter elements for these input diplexers.

As can be seen, high pass capacitors 224 and 226 complete the high pass portion of the input diplexers for the associated transformers. Note that capacitor 224 is coupled to input terminal 230, whereas capacitor 226 is coupled to input terminal 232. Note that the top plates of these capacitors are connected respectively to both the input pad and the associated low pass transformer, with the opposite plate of these capacitors connected to the high band transformer.

To convert the three port device to a four port device, the output has an additional circuit over the three port previous circuit. This circuit constitutes a low pass output diplexer composed of a spiraled inductor 240 associated with output terminal 242, whereas spiral inductor 244 coupled to output terminal 246 duplicates the low pass section of the associated output diplexer. Here, capacitor 248 comprises the high pass section of the first output diplexer, whereas a corresponding capacitor 250 comprises the high pass section of the second output diplexer.

Note that the low band transformers are made up of coupled spiral inductors 200 and 202, whereas the high band transformer is made up of coupled lines 206 and 208.

Since the high band and low band transformers have contiguous bandwidths, the overall bandwidth of the device is the combined bandwidth of these two transformers.

It is noted that the parasitics of the low and high band transformers are absorbed into the diplexer circuitry. Taking the high band transformer, the associated compensated coupled lines are hooked up so that the output corresponds to what would appear at the input side of the high band transformer.

If one looks at the low band response, at the low frequency end of the operation one has a short to ground such that the low band connection looks like a shunt inductor to ground or has an inductive effect to ground. It is noted that it is implicit in the way that the high band transformer is configured that there is effectively an inductance to ground. If one examines the high pass filter section of the output diplexer, one has a series capacitor and inductance to ground so that one does not need another inductance to ground which is already inside of or part of the operation of the high band transformer.

It will be appreciated that what is provided by the subject transformer is a balanced to balanced connection.

It is an added feature of the subject invention that if one applied an unbalanced signal to the inputs to the device, namely a signal having a plus and minus value, this provides a plus and minus signal at the two outputs. If one had identical plus, plus or minus, minus signals at the input they would not pass through the subject structure. When used with single-ended amplifiers in a differential amplifier configuration, it provides the required common mode rejection. By using this wide bandwidth four port transformer with two single-ended amplifiers to form a differential amplifier one obtains an exceptional wideband microwave differential amplifier.

In short, by substituting the subject wideband transformer for the narrow band transformer described above, one can construct a differential amplifier of superior performance than that which could be done with classic long tailed pair topology. Moreover, use of the subject wideband transformer in other microwave applications produces equally good results, especially when used at antenna feed points.

Figure 14:
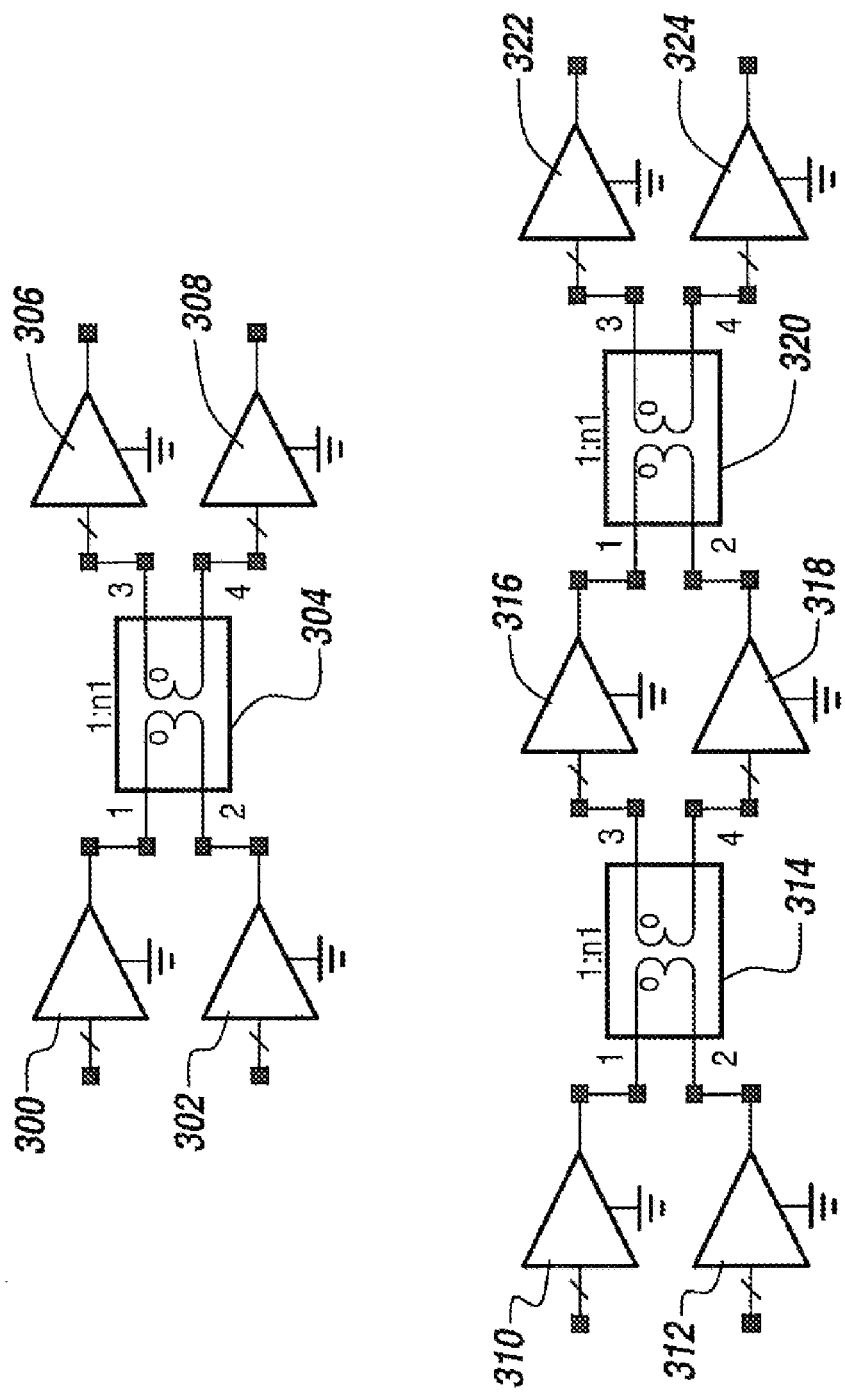
FIG. 14 is a diagrammatic illustration of a differential amplifier in which differential amplifier parts in FIGS. 1 and 2 have been cascaded to form a higher gain version.

Referring now to FIG. 14, different configurations are shown in which a differential amplifier contains additional single-ended amplifiers and additional four port transformers. Here in one configuration, pairs of identical single-ended amplifiers 300 and 302 are connected to a four port transformer 304, the output of which is coupled to identical single-ended amplifiers 306 and 308.

Also, in a cascaded embodiment, single-ended amplifiers 310 and 312 are coupled to a first four port transformer 314, in turn coupled to single-ended amplifiers 316 and 318. The outputs of these amplifiers are in turn coupled to a second four port transformer 320, in turn coupled to single-ended amplifiers 322 and 324.

In the embodiments of FIG. 14, additional gain is provided by the additional amplification stages.

Figure 15:
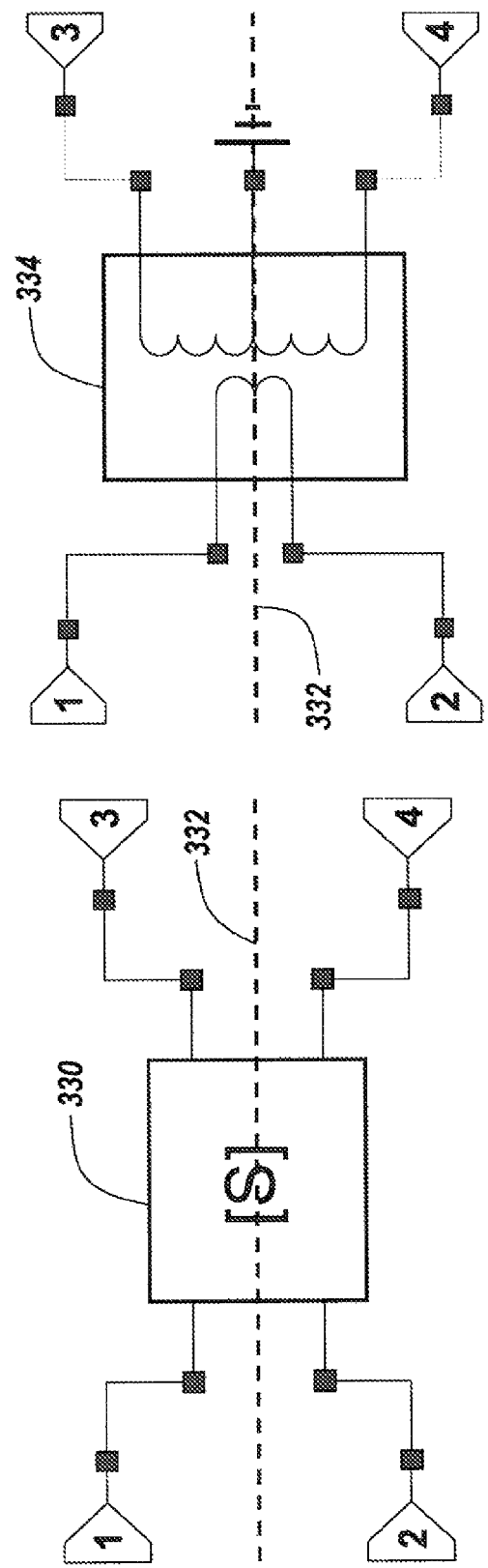
FIG. 15 is a diagrammatic illustration of two versions of symmetry for a four port device with S-parameters and a center-tap transformer, with the dotted line indicating the top-bottom symmetry of these devices.

FIG. 15 is provided to show the top/bottom symmetry of a four port device 330 with S-parameters in which dotted line 332 horizontally bisecting this drawing indicates a top/bottom symmetry.

Likewise, for a center-tapped transformer, here shown at 334, dotted line 332 horizontally bisects this center-tapped transformer, thus illustrating top/bottom symmetry.

Figure 16:
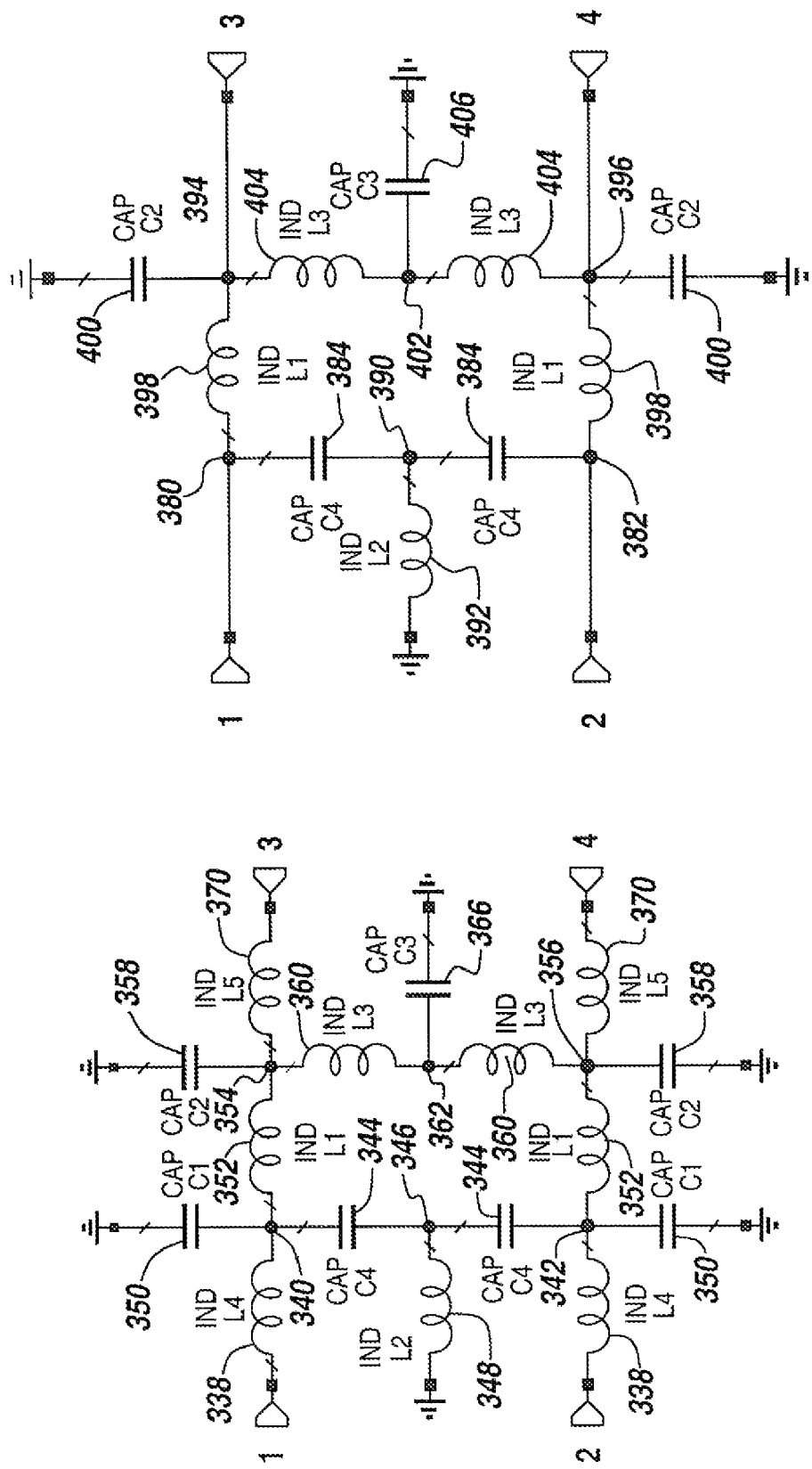
FIG. 16 is a schematic diagram of two LC circuits that meet the four port requirements for a differential amplifier.

Finally, referring to FIG. 16, what is shown are two circuits that meet the four port requirements for a differential amplifier. In this case the ports are labeled 1, 2, 3 and 4.

Referring to the left hand circuit of FIG. 16, inputs 1 and 2 have inductors coupled between the input to nodes 340 and 342 respectively. Capacitors 344 are connected between these nodes and a center-tap node 336, with center-tap node 336 being inductively coupled to ground by an inductor 338.

Note also that nodes 340 and 342 are capacitively coupled to ground by capacitors 350, and have inductors 352 coupled respectively between nodes 340 and 342 and nodes 354 and 356.

Nodes 354 and 356 have capacitors 358 to ground and have inductors 360 between nodes 354 and 356 to a center-tapped node 362 which is capacitively coupled to ground by capacitor 366. Note that nodes 354 and 356 include inductors 370 between them and output ports 3 and 4.

A different LC circuit shown to the right in which inputs 1 and 2 are coupled to nodes 380 and 382, with capacitors 384 coupled between these nodes and a center-tap node 390 coupled to ground through an inductor 392.

Nodes 380 and 382 are coupled to nodes 394 and 396 through inductor 398, with nodes 394 and 396 coupled to ground through capacitor 400.

Nodes 394 and 396 are coupled to a center-tap node 402 through inductors 404, with center-tap node 402 being coupled to ground by capacitor 406. Here it is noted that nodes 394 and 396 are coupled to four port nodes 3 and 4.

What will be seen is that there are a variety of circuits that meet the requirements for a differential amplifier.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

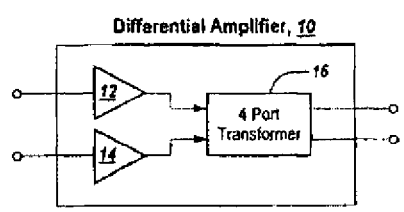

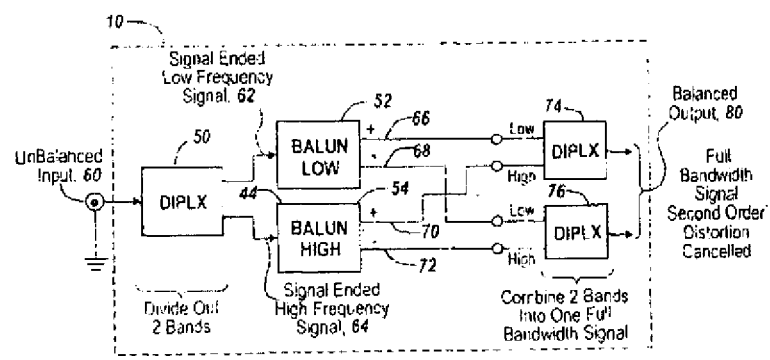

What is claimed is:

1. A method for providing a differential amplifier, comprising:
   providing a four port transformer having the properties of symmetry, reciprocity, and an inverting relationship from one input of the four port transformer to each of the outputs thereof; and
   coupling single-ended amplifiers to the four port transformer for providing a differential amplification function.

2. The method of claim 1, wherein providing the four port transformer includes providing a four port transformer including high band and low band transformers.

3. The method of claim 2, wherein the high band and low band transformers are fabricated using MMIC planar fabrication technology.

4. The method of claim 3, wherein the four port transformers are fabricated utilizing coupled line technology.

5. The method of claim 4, wherein the coupled line technology includes the fabrication of pairs of spiraled coupled lines for the low band transformer and a separate pair of coupled lines to form the high band transformer, and further including providing the transformers with a ground connection equivalent to those of center-tap transformers, this to provide common mode rejection for the differential amplifier, as well as wide bandwidth.

6. A differential amplifier, comprising:
   a plurality of single-ended amplifiers; and
   a four port transformer having the properties of symmetry, reciprocity, and an inverting relationship from one input of the transformer to each of the outputs thereof, whereby said differential amplifier is provided with common mode rejection and suppression of intermodulation distortion signals along with a wide bandwidth.

7. The differential amplifier of claim 6, wherein said four port transformer includes a diplexer unit for dividing an incoming signal into a high band and a low band signal, and wherein said four port transformer includes a high band transformer and a low band transformer coupled respectively to said high band and low band signals.

8. The differential amplifier of claim 7, wherein said four port transformer includes coupled lines.

9. A differential amplifier, comprising
   a plurality of single-ended amplifiers; and
   a four port network having the properties of symmetry, reciprocity, and an inverting relationship from one input of the four port network to each of the outputs thereof.

10. The differential amplifier of claim 9, wherein said four port network is made with inductors, capacitors, and other passive components.

11. The differential amplifier of claim 9, wherein said differential amplifier includes cascaded multiple stages, transformers or four port networks having the properties of symmetry, reciprocity, and an inverting relationship from one input thereof to each of the outputs thereof.

12. The differential amplifier of claim 9, wherein respective ports of the four port transformer are coupled to respective ones of the plurality of single-ended amplifiers.

13. The differential amplifier of claim 12, wherein the respective ports of the four port transformer are directly coupled to the respective ones of the plurality of single-ended amplifiers.

14. The differential amplifier of claim 6, wherein respective ports of the four port transformer are coupled to respective ones of the plurality of single-ended amplifiers.

15. The differential amplifier of claim 14, wherein the respective ports of the four port transformer are directly coupled to the respective ones of the plurality of single-ended amplifiers.

16. The method of claim 1, wherein said coupling single-ended amplifiers to the four port transformer comprises directly coupling the single-ended amplifiers to the four port transformer.

* * * * *

UNITED STATES PATENT AND TRADEMARK OFFICE
CERTIFICATE OF CORRECTION

| | | |
|---|---|---|
| PATENT NO. | : 8,362,835 B2 | Page 1 of 3 |
| APPLICATION NO. | : 13/214345 | |
| DATED | : January 29, 2013 | |
| INVENTOR(S) | : Meharry | |

It is certified that error appears in the above-identified patent and that said Letters Patent is hereby corrected as shown below:

On the Title Page, illustrative Fig. 6 should be deleted and substitute therefor the attached title page consisting of Figs. 1 and 6.

On the Title Page, "Related U.S. Application Data", in Column 1, Line 1, delete Item "(60)" and insert Item -- (62) --, therefor.

On the Title Page, in the Figure, in Column 2, delete "Balanced Input, 60" and insert -- Unbalanced Input, 60 --, therefor.

In the Drawings

In Fig. 6, Sheet 3 of 14, delete "Balanced Input, 60" and insert -- Unbalanced Input, 60 --, as shown on the attached drawing sheet.

In the Specification

In Column 3, Line 44, delete "two. outputs." and insert -- two outputs. --, therefor.

In the Claims

In Column 10, Line 44, in Claim 5, delete "this to" and insert -- thus to --, therefor.

In Column 10, Line 63, in Claim 9, delete "comprising" and insert -- comprising: --, therefor.

Signed and Sealed this
Twelfth Day of August, 2014

Michelle K. Lee
*Deputy Director of the United States Patent and Trademark Office*

(12) United States Patent
Meharry

(10) Patent No.: US 8,362,835 B2
(45) Date of Patent: Jan. 29, 2013

(54) DECADE BANDWIDTH PLANAR MMIC FOUR PORT TRANSFORMER

(75) Inventor: David E. Meharry, Lexington, MA (US)

(73) Assignee: Gradual Tech Software L.L.C., Dover, DE (US)

( * ) Notice: Subject to any disclaimer, the term of this patent is extended or adjusted under 35 U.S.C. 154(b) by 0 days.

(21) Appl. No.: 13/214,345

(22) Filed: Aug. 22, 2011

(65) Prior Publication Data
US 2011/0304391 A1 Dec. 15, 2011

Related U.S. Application Data

(60) Division of application No. 12/493,907, filed on Jun. 29, 2009, now Pat. No. 8,026,775, which is a continuation-in-part of application No. 11/708,992, filed on Feb. 20, 2007, now Pat. No. 7,592,866, and a continuation-in-part of application No. 11/715,705, filed on Mar. 8, 2007, now Pat. No. 7,557,673.

(60) Provisional application No. 60/780,640, filed on Mar. 9, 2006, provisional application No. 60/774,582, filed on Feb. 17, 2006.

(51) Int. Cl.
H03F 1/00 (2006.01)

(52) U.S. Cl. .................. 330/195; 330/165; 330/301

(58) Field of Classification Search .................. 330/195, 330/165, 301
See application file for complete search history.

(56) References Cited

U.S. PATENT DOCUMENTS

| | | | |
|---|---|---|---|
| RE25,064 E * | 10/1961 | Kruesi | 342/417 |
| 3,885,219 A * | 5/1975 | Vaughn | 330/255 |
| 3,972,020 A * | 7/1976 | Carroll et al. | 367/45 |
| 4,397,037 A | 8/1983 | Theriault | |
| 4,606,046 A | 8/1986 | Ludwick | |
| 4,647,868 A | 3/1987 | Mueller | |
| 4,703,283 A | 10/1987 | Samuels | |
| 5,822,426 A | 10/1998 | Rasmus et al. | |
| 6,046,641 A | 4/2000 | Chawla et al. | |
| 6,545,542 B2 | 4/2003 | Matsuyoshi et al. | |
| 6,683,510 B1 | 1/2004 | Padilla | |
| 6,696,885 B2 * | 2/2004 | Christensen | 327/552 |
| 6,792,252 B2 * | 9/2004 | Kimball et al. | 455/127.3 |
| 7,119,615 B2 * | 10/2006 | Ten Dolle et al. | 330/252 |
| 7,242,268 B2 | 7/2007 | Hagiwara et al. | |
| 7,580,693 B2 | 8/2009 | Rohde et al. | |
| 2008/0007335 A1 | 1/2008 | Park et al. | |

OTHER PUBLICATIONS

Maas, Nonlinear Microwave Circuits, Artech House Inc., Norwood, MA 1988. pp. 226-231 & pp. 240-243.
Cripps, Advanced Techniques in RF Power Amplifier Design, Artech House Inc., Norwood, MA, 2002, pp. 272-279.
Meharry et al., Broad bandwidth Transformer Coupled Differential Amplifiers for High Dynamic Range, IEEE Journal of Solid-State Circuits, vol. 34, No. 9, Sep. 1999, pp. 1233-1238.
Oltman, The Compensated Balun, IEEE Transactions on Microwave Theory and Techniques, vol. MTT-14, No. 3, Mar. 1966, pp. 112-119.
Tsai, A New Compact Wideband Balun, IEEE Microwave and Millimeter-Wave Monolithic Circuits Symposium, 1993, pp. 123-124.

(Continued)

*Primary Examiner* — Patricia Nguyen
(74) *Attorney, Agent, or Firm* — Connolly Bove Lodge & Hutz LLP

(57) ABSTRACT

A wide bandwidth planar four port MMIC transformer is provided by input diplexers which divide up the incoming signal into a high band and a low band, with the resulting signals coupled to high band and low band four port transformers implemented in one embodiment using spiral inductors and coupled lines, the outputs of which are combined using two output diplexers to provide a decade bandwidth transformer.

16 Claims, 14 Drawing Sheets